United States Patent [19]

Yanagi et al.

[11] Patent Number: 5,288,386
[45] Date of Patent: Feb. 22, 1994

[54] SPUTTERING APPARATUS AND AN ION SOURCE

[75] Inventors: Kenichi Yanagi; Mitsuo Kato; Kazuya Tsurusaki; Toshio Taguchi; Kenji Atarashiya; Tadashi Rokkaku; Ichiro Yamashita, all of Hiroshima, Japan

[73] Assignee: Mitsubishi Jukogyo Kabushiki Kaisha, Tokyo, Japan

[21] Appl. No.: 913,927

[22] Filed: Jul. 17, 1992

[30] Foreign Application Priority Data

| Jul. 18, 1991 | [JP] | Japan | 3-178114 |
| Jul. 18, 1991 | [JP] | Japan | 3-178115 |
| Jul. 18, 1991 | [JP] | Japan | 3-178116 |
| Aug. 16, 1991 | [JP] | Japan | 3-205906 |
| Aug. 16, 1991 | [JP] | Japan | 3-205907 |

[51] Int. Cl.$^5$ .................................... C23C 14/35
[52] U.S. Cl. ...................... 204/298.16; 204/298.06; 204/298.12; 204/298.18; 204/298.19; 204/298.26
[58] Field of Search ............. 204/298.06, 298.07, 204/298.16, 298.17, 298.18, 298.19, 298.26, 298.12

[56] References Cited

U.S. PATENT DOCUMENTS

| 4,841,197 | 6/1989 | Takayama et al. | 315/111.81 |
| 4,946,576 | 8/1990 | Dietrich et al. | 204/298.06 |
| 5,122,252 | 6/1992 | Latz et al. | 204/298.26 |
| 5,154,810 | 10/1992 | Kamerling et al. | 204/192.13 |

FOREIGN PATENT DOCUMENTS

| 205028 | 12/1986 | European Pat. Off. | 204/298.23 |
| 339554 | 11/1989 | European Pat. Off. | |
| 376017 | 7/1990 | European Pat. Off. | 204/298.21 |
| 3920835 | 1/1991 | Fed. Rep. of Germany | 204/298.26 |
| 217082 | 2/1985 | German Democratic Rep. | |

Primary Examiner—Aaron Weisstuch
Attorney, Agent, or Firm—Jacobson, Price, Holman & Stern

[57] ABSTRACT

A sputtering apparatus including two electrodes, a sputtering target disposed on one of the electrodes, and a gas supply for supplying a discharge gas in a vacuum to produce an electric discharge between the two electrodes and whereby particles sputtered from the target due to impact thereon of ions produced by the discharge, are deposited on a substrate. The target disposed on one electrode is formed into an elongated band and the other electrode is disposed so as to enclose the target. The other electrode is also provided with a magnet for producing a magnetic field thereon, and further includes a narrow elongated slot which defines a narrow sputter particle outlet. The narrow sputter particle outlet permits a pressure to exist near the electrical discharge which is higher than the pressure near the substrate. According to a preferred embodiment, the sputtering apparatus has an ion source combined integrally therewith.

2 Claims, 19 Drawing Sheets

SPUTTERING APPARATUS AND AN ION SOURCE

FIELD OF THE INVENTION AND RELATED ART STATEMENT

A first embodiment of the invention relates to an ion source for use in an ion implantation apparatus and an ion deposition apparatus, which is suitable for a long object.

A second embodiment of the invention relates to an ion source for use in an ion implantation apparatus and an ion deposition apparatus, which is suitable for a long object.

A third embodiment of the invention relates to an ion source for use in an ion implantation apparatus and an ion deposition apparatus, which is suitable for a long object.

A fourth embodiment of the invention relates to a sputtering apparatus in which an object to be filmed is a long object.

A fifth embodiment of the invention relates to a sputtering apparatus in which an object to be filmed is a long object and which is integrally formed with an ion source.

FIG. 18 shows a structure of a conventional ion source. In FIG. 18, numeral 41 denotes an anode electrode in the form of a case; numeral 42 denotes permanent magnets for forming local magnetic fields 43; numeral 44 denotes filament cathodes; numeral 45 denotes an electrode for extracting ions formed within a plasma producing chamber formed by the anode electrode 41; numeral 46 denotes gas introduction holes for introducing gas required for discharge; and numeral 47 denotes an insulator.

The local magnetic fields 43 are formed by the permanent magnets 42 within a wall surface of the plasma producing chamber formed by the anode electrode 41 to generate electric discharge between the anode electrode 41 and the filament cathodes 44. Electrons discharged from the filament cathodes 44 are restrained by means of the magnetic fields 43 to increase the plasma density in the vicinity of the filament cathodes 44 to thereby increase the ion producing efficiency. The gas required for the electric discharge is introduced from the gas introduction holes 46 and ions within the plasma producing chamber are extracted by an electric field applied to the electrode 45.

It is well known to use a sputtering apparatus for forming thin-film structures.

The principle of the sputtering apparatus will now be described with reference to FIG. 19. FIG. 19 illustrates a structure of a conventional sputtering apparatus.

In FIG. 19, numerals 1 and 2 denote electrodes. A target 3 is attached to one electrode 1. Gas 5 for sputtering is introduced into the space 4 between the two electrodes 1 and 2 in vacuum, and an electric discharge is produced between the two electrodes 1 and 2. The introduced gas 5 is ionized and the ionized gas is moved by an electric field force to impinge the target 3 at the electrode 1. When ions impinge the target 3, particles are expelled from the target 3 thus providing a sputtering phenomenon. Objects 6 to be coated are attached to the other electrode 2 and the sputtered particles from the target 3 are deposited on the objects 6 to thereby form a film on the objects 6.

Using the above principle, various modifications are made to the sputtering apparatus in accordance with particular applications of the principle and existing conditions:

(1) A long object is to be coated with a film:

In this case, the two electrodes 1 and 2 are opposed to each other in a straight line to produce electric discharge. Further, in order to produce uniform electric discharge in a straight line, a permanent magnet capable of producing a magnetic field is mounted to the electrode 1 or the side of the target 3.

(2) Maintenance of electric discharge at low vacuum pressure:

The quality of the deposited film is often improved when the sputtering phenomenon occurs at a low vacuum pressure. However, it is difficult to maintain an electric discharge at low vacuum pressures. Accordingly, a generally effective technique is to produce a magnetic field by means of a permanent magnet. That is, an electron trap operation produced by a magnetic field in an electric discharge area is utilized to form a structure for maintaining electric discharge at a low vacuum pressure. In particular, reference is made to the rotary motion of the electrons illustrated in FIG. 20.

In order to maintain electric discharge between the electrodes 1 and 2, electric power is supplied to the electrodes 1 and 2 by a power supply 7 as shown in FIG. 19.

The conventional ion source has the following drawbacks:

(1) The energy of ions extracted from the ion source is determined by the potential of the anode electrode 41. In an ion implantation apparatus or the like, in order to obtain a high-energy ion beam, it is necessary to provide an ion acceleration system separately and to accelerate the ions by means of an acceleration voltage.

(2) In order to supply electrons for maintaining discharge, the filament cathodes 44 are used. However, since the filament cathodes 44 are heated by themselves, there is a problem that the life of the filament cathodes is short (several tens of hours) and the filament cathodes 44 require frequent replacement.

The conventional sputtering apparatus has the following problems.

(1) The film is required to be formed in an atmosphere of low vacuum pressure. Accordingly, target structure has been adopted in which a magnetic field is produced in a portion of the target 3. FIG. 21 shows that by producing the magnetic field there is an area where stable electric discharge can be achieved even with a low vacuum pressure (horizontal axis). As is apparent from FIG. 21, it is difficult to maintain electric discharge below $3 \times 10^{-1}$ Torr ($3 \times 10^{-1}$ mTorr) and electric discharge can not be maintained when the vacuum pressure is above about $3 \times 10^{-1}$ Torr even if a magnetic field is used.

(2) Further, there is a great need for a sputtering apparatus in which a long member is coated with a film. However, sputtering apparatus in which films can be formed in an atmosphere of low vacuum pressure and the object to be filmed is a long member has not been developed as yet.

(3) Additionally, there is a problem that when ion irradiation and irradiation of sputtered particles are made from the same direction, it is impossible in view of a structural restriction to use the conventional ion source and sputtering apparatus independently.

OBJECTS AND SUMMARY OF THE INVENTION

It is an object of the present invention to provide an ion source for producing a planar discharge plasma.

It is a further object of the present invention to provide an ion source for producing a uniform, high-density, high-energy, and planar discharge plasma.

Another object of the present invention is to provide an ion source for producing a circular discharge plasma having a plasma flow directed to a center thereof.

It is a still further object of the present invention to provide a sputtering apparatus capable of forming a film on a long straight object.

Yet another object of the present invention is to provide a sputtering apparatus capable of performing ion irradiation and irradiation of sputtered particles simultaneously from the same direction.

In order to achieve the first object, according to a first embodiment of the invention, in an ion source in which discharge gas is fed in vacuum and DC or high-frequency discharge plasma occurs so that ions are extracted from the discharge plasma, there are provided a hollow cathode having an ion extraction outlet extending in the form of a straight slot and a straight acceleration electrode disposed to control the energy of the extracted ions and to fit the shape of the hollow cathode.

The hollow cathode having the ion extraction outlet extending in the form of straight slot is used to produce a straight discharge plasma and a straight acceleration electrode is used to accelerate straight path ions extracted from the discharge plasma and to accelerate the ion beam with a uniform electric field.

In order to achieve the second object, according to an embodiment of the invention, in an ion source in which discharge gas is fed in vacuum and DC or high-frequency discharge plasma occurs so that ions are extracted from the discharge plasma, there are provided a hollow cathode having an ion extraction outlet extending in the form of straight slot and a magnetic flux producing mechanism having a magnet for effectively producing discharge plasma.

In order to achieve the second object, according to another embodiment of the invention, in an ion source in which discharge gas is fed in vacuum and DC or high-frequency discharge plasma occurs so that ions are extracted from the discharge plasma, there are provided a hollow cathode having an ion extraction outlet extending in the form of straight slot, a magnetic flux producing mechanism having a magnet for effectively producing discharge plasma, and an acceleration electrode for controlling the energy of the extracted ions.

The hollow cathode having the ion extraction outlet extending in the form of a straight slot is used to produce a straight discharge plasma and lengthen the life of the electrode. Further, a magnetic field is produced by the magnet of the magnetic flux producing mechanism to improve uniformity and density of the straight discharge plasma. The acceleration electrode is used to accelerate ions extracted from the discharge plasma and accelerate the ion beam with a uniform electric field.

In order to achieve the third object, according to another embodiment of the invention, in an ion source in which discharge gas is fed in vacuum and DC or high-frequency discharge plasma occurs so that ions are extracted from the discharge plasma, a hollow cathode having an ion extraction outlet extending in the form of a slot is provided, and the ion extraction outlet of the hollow cathode is formed into a circumferential shape.

The hollow cathode formed into the circumferential shape and having the ion extraction outlet in the form of a slot is used to concentrate ions extracted from the discharge plasma into one portion and lengthen the life of the electrode.

In order to achieve a fourth object, according to another embodiment of the invention, in a sputtering apparatus including two electrodes and a target disposed on one of the electrodes and in which discharge gas is fed in vacuum to produce electric discharge between the two electrodes and particles of the target sputtered due to impact of ions produced by the discharge are deposited on a substrate, the sputtering target mounted on one electrode is formed into a band and the other electrode is disposed so as to enclose the target, which is provided with a magnet for producing a magnetic field, and the area of the sputtered particle outlet opening of the other electrode is made narrow.

The target is formed into a band and the other electrode is disposed to enclose the target, so that a long object can be coated with a film. The area of the sputter outlet opening is made narrow, and the pressure within the other electrode can be made higher than the pressure outside of the electrode in which the object to be filmed is present and the pressure of the atmosphere near the object to be coated can be made low. Further, a magnetic field is produced in the target by the magnet to control the motion of the electrons and the electric discharge is maintained at a low pressure.

In order to achieve a fifth object, according to another embodiment of the invention, in a sputtering apparatus including an ion source in which discharge gas is fed in vacuum and DC or high-frequency discharge plasma occurs so that ions are extracted from the discharge plasma and which includes a hollow cathode having an ion extraction outlet extending in the form of a straight slot, a magnetic flux producing mechanism having a magnet for effectively producing discharge plasma, two electrodes, a target disposed on one of the electrodes, and in which discharge gas is fed in vacuum to produce electric discharge between the two electrodes, whereby the target is sputtered due to impact of ions produced upon the discharge to deposit a film on a substrate, the target mounted on one electrode is formed into a band and the other electrode is disposed to enclose the target, which is provided with a magnet for producing a magnetic field, and the area of a sputtered particle outlet opening of the other electrode is made narrow to form means integral with the sputtering apparatus to irradiate ions and sputtered particles from the same direction to the object to be filmed.

The hollow cathode having the ion extraction outlet extending in the form of a straight slot is used to produce a straight discharge plasma and lengthen the life of the electrode. Further, a magnetic field is produced by the magnet of the magnetic flux producing mechanism to improve uniformity and density of the straight discharge plasma. The acceleration electrode is used to accelerate ions extracted from discharge plasma and accelerate the ion beam with a uniform electric field.

The target is formed into a band and the other electrode is disposed to enclose the target, so that long objects can be coated with a film. The area of the sputter outlet opening is made narrow, and the pressure within the other electrode can be made higher than the pressure outside of the electrode in which the object to be filmed is present and the pressure of the atmosphere near the object to be filmed can be made low. Further, a magnetic field is produced in the target by the magnet to control the motion of the electrons and electric discharge is maintained at a low pressure.

Further, the ion source and the sputtering apparatus are formed integrally, so that the ion irradiation and the sputtered particle irradiation are made simultaneously from the same direction and the relative angle of irradiation axes of ions and sputtered particles is fixed at all times. Further, since the ion outlet of the ion source and the sputtered particle outlet of the sputtering apparatus are directed to the same direction, sputtered particles do not enter the ion source. In addition, a vacuum seal, a cooling means, and an anode electrode can be shared.

DETAILED DESCRIPTION OF THE PREFERRED EMBODIMENTS

Figure 1A:
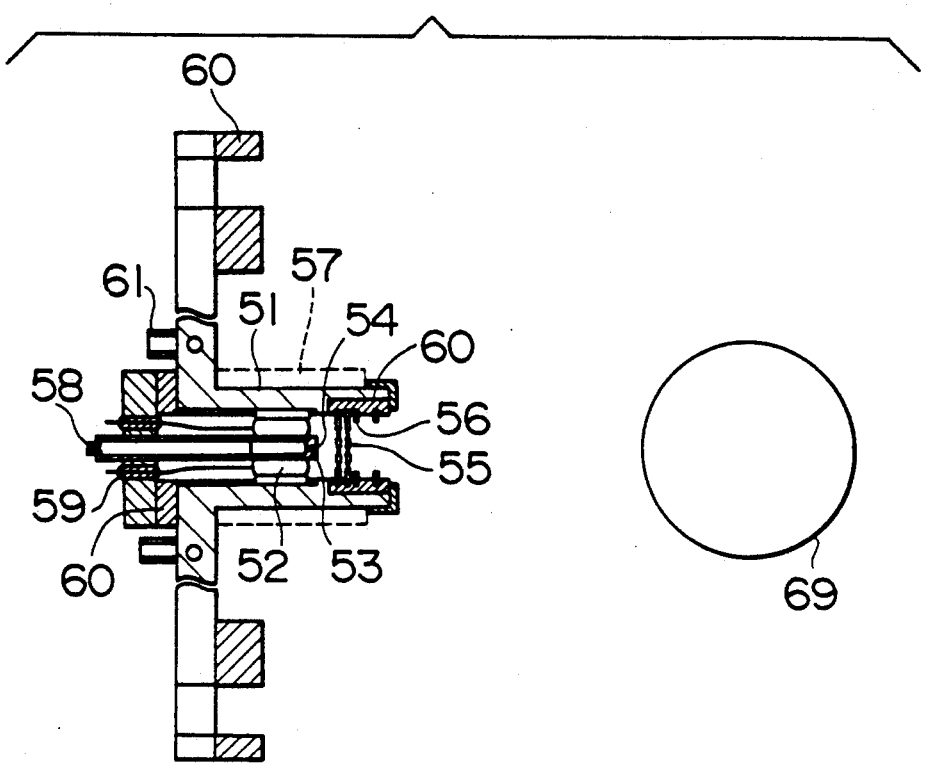
FIG. 1(a) is a side view of an ion source according to the first embodiment of the present invention.
Figure 1B:
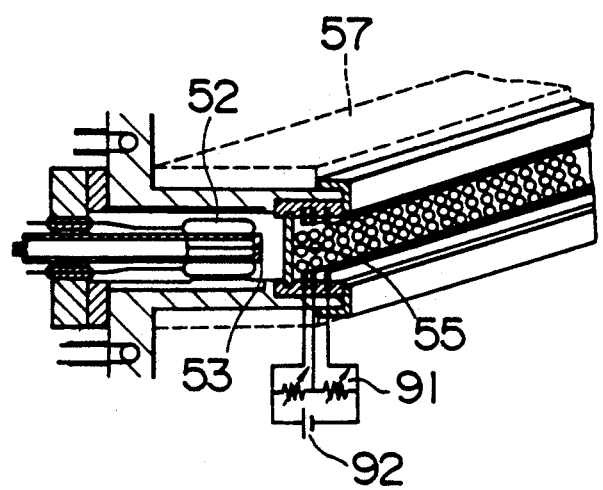
FIG. 1(b) is a schematic illustration of the embodiment shown in FIG. 1(a).
Figure 2:
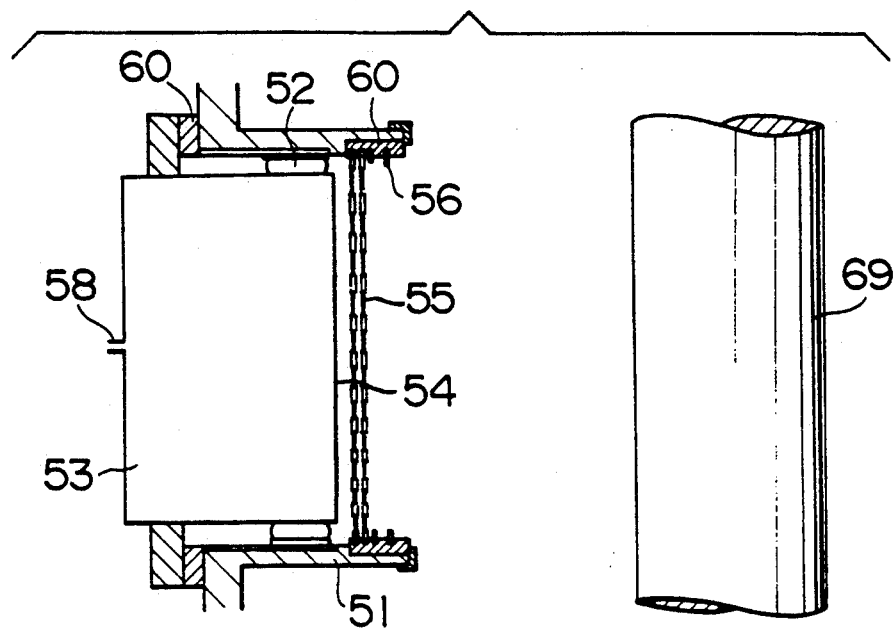
FIG. 2 is a plan view of an ion source according to a first embodiment of the present invention.
Figure 3:
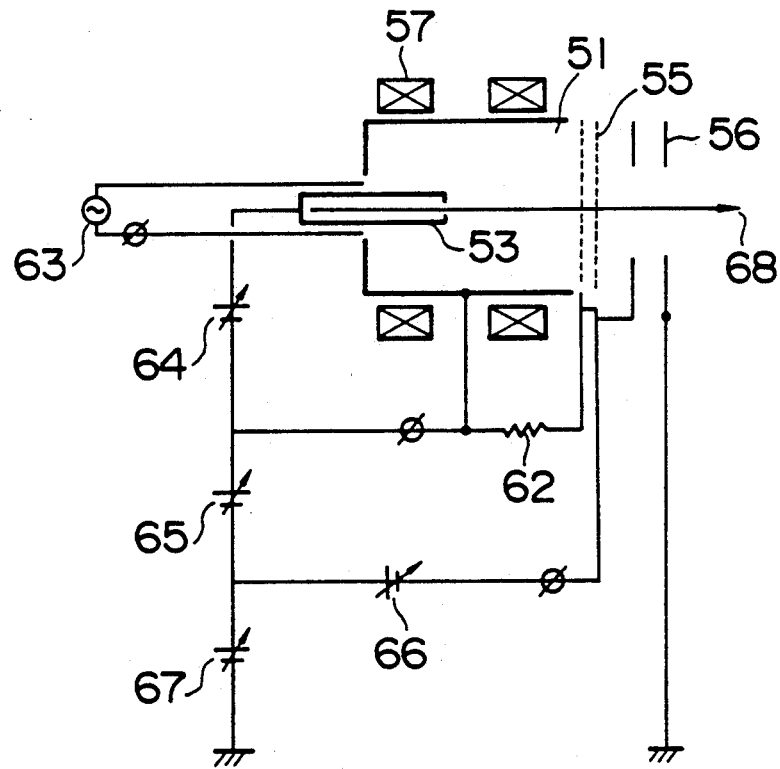
FIG. 3 is a circuit diagram of an ion source according to the first embodiment of the present invention.

FIGS. 1(a) and (b) are schematic diagrams illustrating an ion source according to an embodiment of the invention. FIG. 2 is a plan view of the ion source of FIG. 1, and FIG. 3 is a circuit diagram thereof.

In the above figures, numeral 51 denotes an anode electrode to which a hollow cathode 53 is attached through a cathode heater 52. An ion extraction outlet 54 of the hollow cathode 53 extends in the form of straight slot and an ion extraction electrode 55 extending in the form of a band is disposed in front of the ion extraction outlet 54. An acceleration electrode 56 for controlling the energy of the extracted ions is disposed in front of the ion extraction electrode 55 and the acceleration electrode 56 is formed into a slot to match the shape of the hollow cathode 53 as shown in FIG. 1(b). A permanent magnet 57 is disposed outside of the anode electrode 51 as a magnetic field producing mechanism to improve uniformity and density of the straight discharge plasma. The hollow cathode 53 is provided with a gas introducing hole 58 whereby discharge gas is introduced into the hollow cathode 53 from the gas introducing hole 58. In FIG. 1, numeral 59 denotes a heater current introducing terminal, 60 an insulator, and 61 a cooling water path. In FIG. 3, numeral 62 denotes a starting resistor, 63 a heater current source, 64 a discharge power source, 65 a beam energy supply power source, 66 an ion extraction power source, 67 an ion acceleration electrode, and 68 an ion beam. Further, in FIG. 1(b), numeral 91 denotes a resistor, and 92 an acceleration power supply.

The above-described ion source can cope with a long object 69. When discharge gas is introduced via the gas introduction hole 58 into the hollow cathode 53 having the ion extraction outlet 54 in the form of straight slot, the hollow cathode 53 is heated by the cathode heater 52 at the same time and is supplied with electrons by discharge between the anode electrode 51 and the hollow cathode 53 so that the discharge between the anode electrode 51 and the hollow cathode 53 is maintained by means of electrons.

Since the ion extraction outlet 54 of the hollow cathode is formed into a band, a straight band-shaped supply of electrons produces plasma in the form of a band. Ions in the form of a band are extracted from the band-shaped plasma by means of the extracting electric field applied to the ion extraction electrode 55. When it is necessary to increase the energy of the ions for processing the long object 69, an acceleration electric field can be applied to the acceleration electrode 56 disposed immediately after the ion extraction electrode 55 to obtain a predetermined ion energy. The acceleration electrode 56 can effectively accelerate the ion beam in the form of a band by provision of the band-shaped hole. A circuit configuration of the ion source is shown in FIG. 3.

In the above ion source, a uniform band-shaped ion beam can be obtained stably for a long time by the provision of the hollow cathode 53 having a slot-shaped ion extraction outlet 54, the acceleration electrode 56 in the form of a slot, and the permanent magnet 57. Ions can be accelerated without separate provision of an acceleration system.

A band-shaped ion extraction structure using a DC discharge plasma has been shown by way of example. However, the band-shaped ion extracting acceleration can also be made by using a high frequency discharge (for example, ECR).

Figure 4:
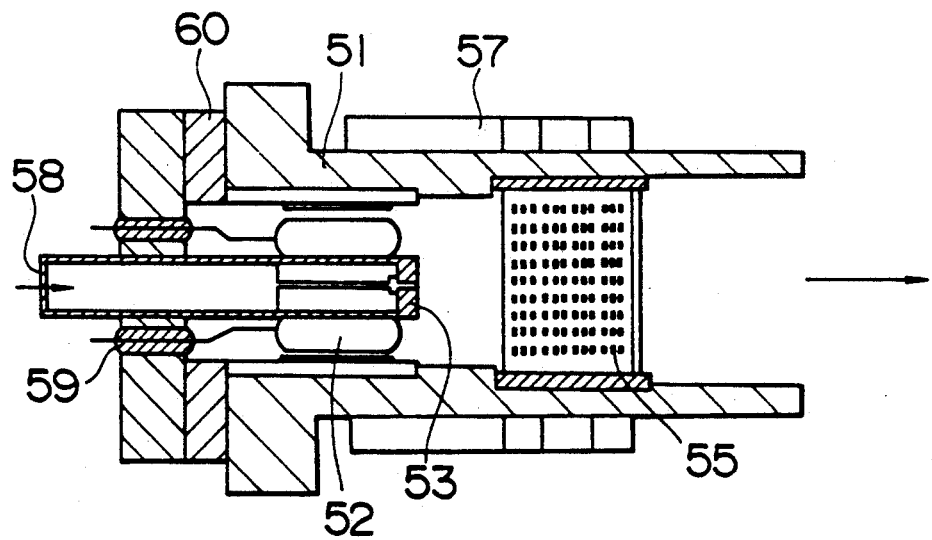
FIG. 4 is a side view of an ion source according to a second embodiment of the present invention.
Figure 5:
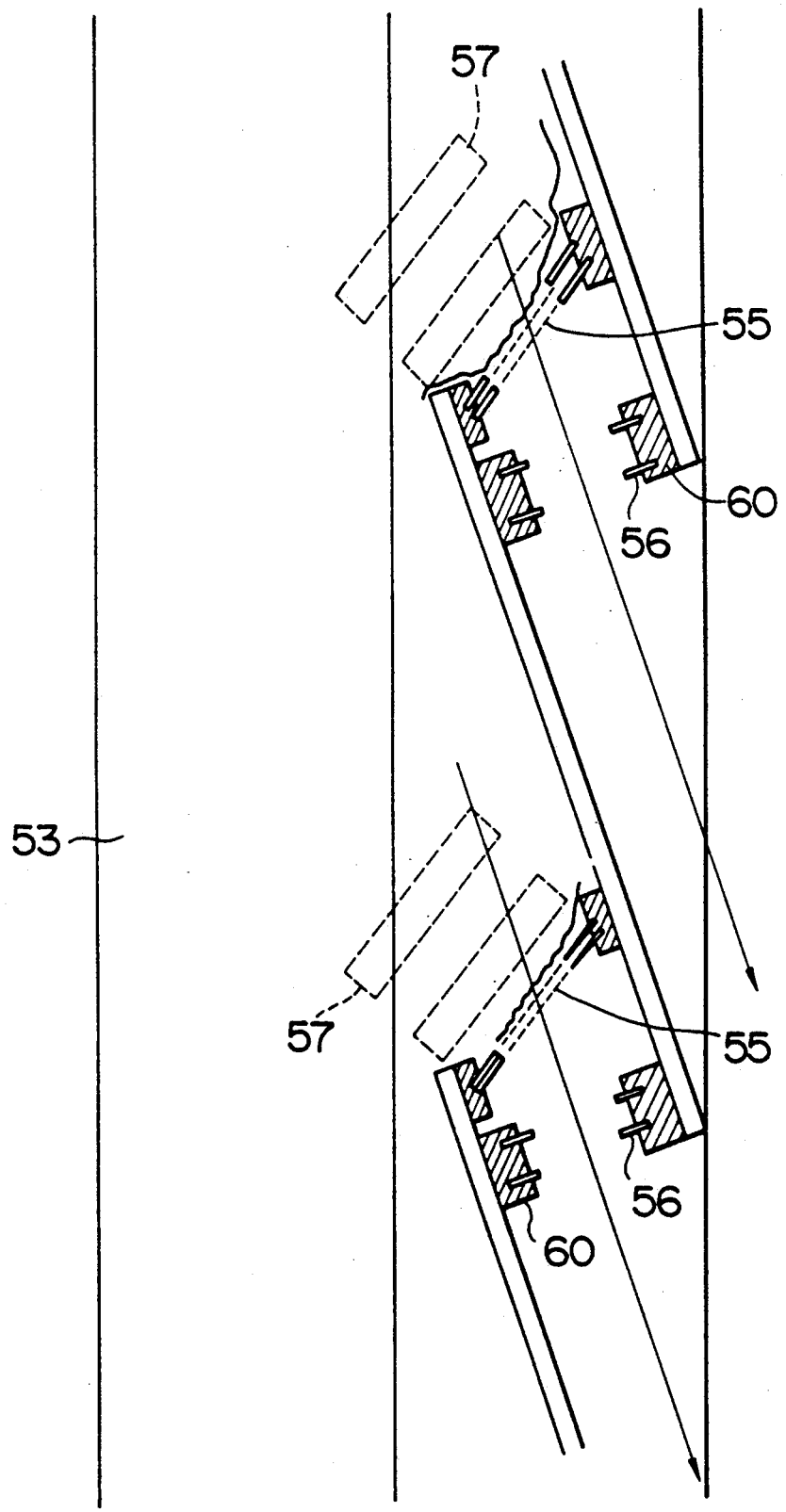
FIG. 5 is a plan view of an ion source according to the second embodiment of the present invention.

When the long object 69 is desired to be irradiated by an ion beam with a fixed angle, the ion extraction electrode 55 and the acceleration electrode 56 can be inclined as shown in FIGS. 4 and 5 if there is no room in the disposition space of a vacuum apparatus. In FIGS. 4 and 5, by shifting the phase between two ion extraction electrodes 55, ions having a fixed angle with respect to a drawing plane can be obtained.

Since the ion source of the present invention comprises a hollow cathode having an ion extraction outlet extending in the form of straight slot and the straight acceleration electrode matched to a shape of the hollow cathode provided to control energy of the extracted ions, a straight discharge plasma is produced and the life of the electrode is lengthened, so that straight path ions drawn from discharge plasma can be accelerated.

Figure 6:
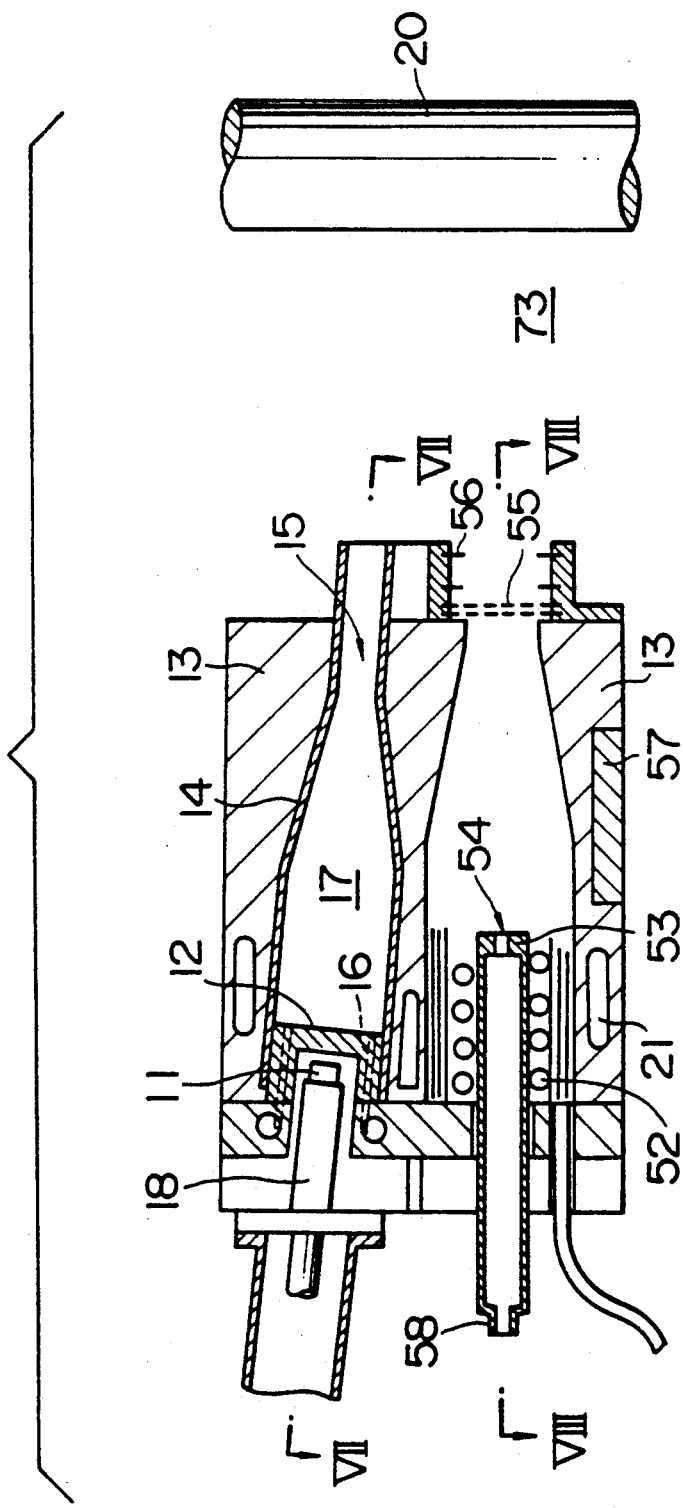
FIG. 6 is a sectional view of a sputtering apparatus including an ion source according to a third embodiment of the present invention.
Figure 7:
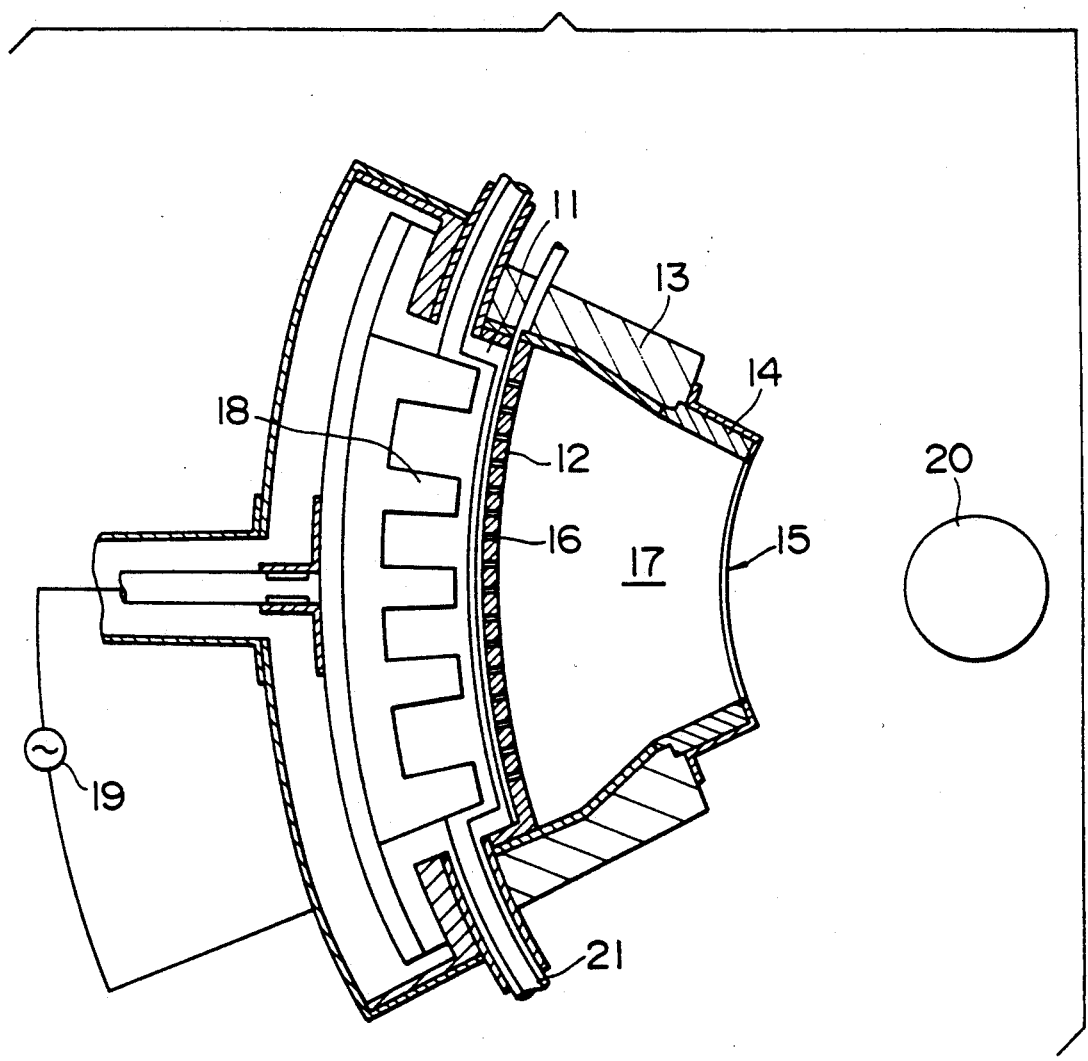
FIG. 7 is a view taken along line II—II of FIG. 6.
Figure 8:
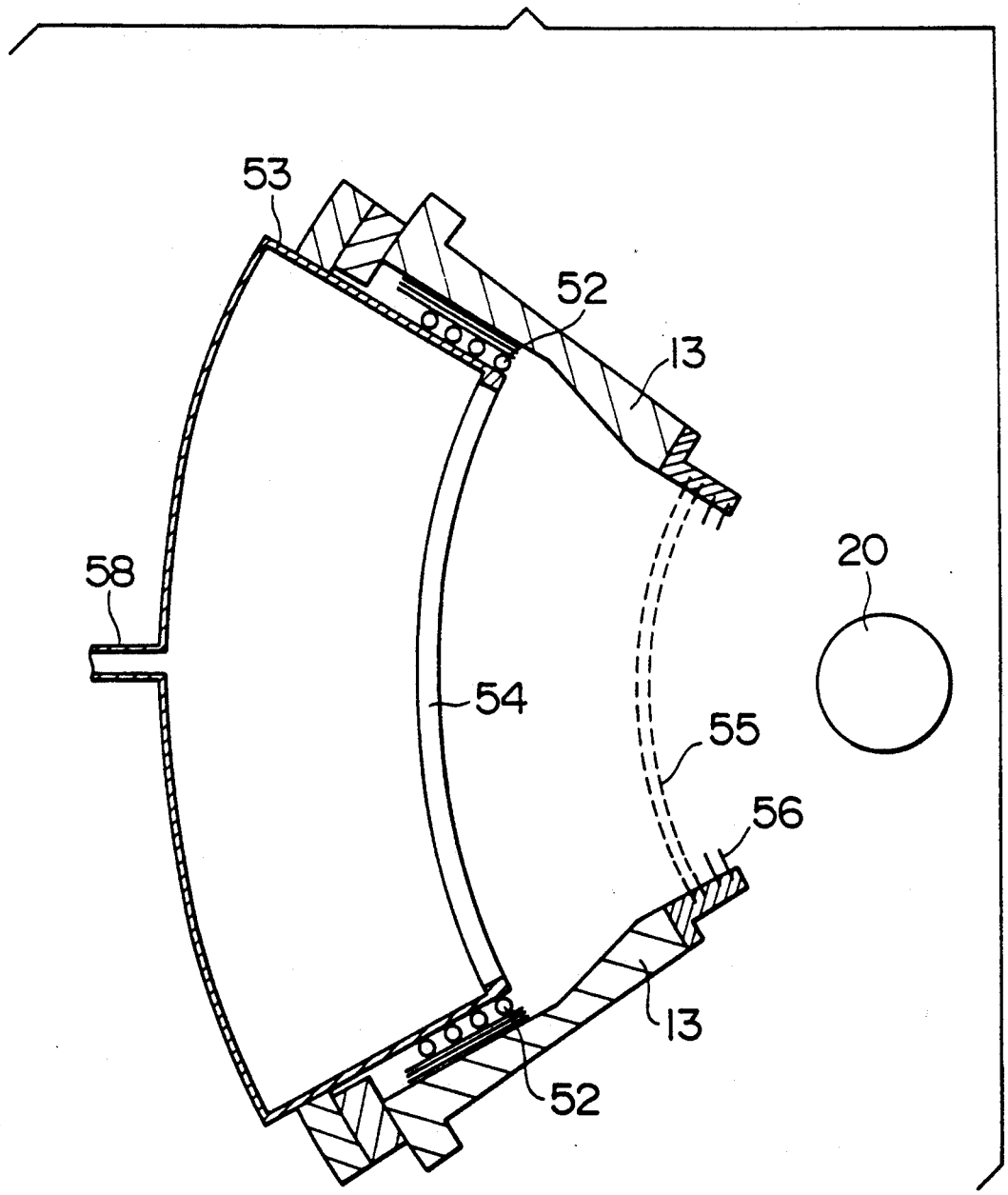
FIG. 8 is a view taken along line III—III of FIG. 6.

FIG. 6 is a sectional view of a sputtering apparatus including an ion source according to a third embodiment, FIG. 7 is a diagram taken along line VII—VII of FIG. 6, and FIG. 8 is a diagram taken along line VIII—VIII of FIG. 6.

In the figures, numeral 11 denotes an electrode which is provided with a circumferential band-shaped target 12. The other electrode (anode electrode) 13 encloses the target 12, and an insulator 14 is disposed between the electrode 13 and the target 12.

A sputter outlet opening 15 of the anode electrode 13 disposed opposite the electrode 11 to position the target 12 between the opening 15 and the electrode 11 is formed in to a narrow shape as shown in FIG. 6 and the area thereof is made small. A gas introduction inlet 16 is formed in the target 12 and sputtering gas is introduced via inlet 16 into the space enclosed by the anode electrode 13 between the target 12 and the opening 15. Thus, the gas pressure within the space is maintained relatively high.

A permanent magnet 18 is disposed at the opposite side of the target 12 and a magnetic field is produced by the permanent magnet 18 in a portion of the electrode 11 on which the target 12 is disposed. The magnet is not limited to a permanent magnet 18 and may be an electromagnet.

The electrode 11 and the anode electrode 13 are supplied with electric power by means of an external power supply 19. In FIG. 7, numeral 21 denotes a cooling water pipe through which cooling water flows to remove heat generated upon sputtering.

The ion source portion of FIG. 6 is now described with reference to FIG. 8.

A hollow cathode 53 is attached to the anode electrode 13 through a cathode heater 52. An ion extraction outlet 54 of the hollow cathode extends in the form of circumferential band and an ion extraction electrode 55 extending in the form of circumferential band is disposed in front of the ion extraction outlet 54. An acceleration electrode 56 for controlling the energy of the extracted ions is disposed in front of the ion extraction electrode 55 and is formed into a slot to match to the shape of the hollow cathode 53. A permanent magnet 57 is disposed outside of the anode electrode 13 as a magnetic field producing mechanism to improve uniformity and density of the straight discharge plasma. A gas introducing hole 58 is provided in the hollow cathode 53 to introduce discharge gas into the hollow cathode 53 from the gas introducing hole 58.

As shown in FIGS. 6 and 7, the opening 15 and the ions extraction outlet 54 are formed into a circumference sufficient to enclose the outer periphery of the cylindrical object 20 to be coated. Discharge gas is introduced from the gas introducing hole 58 into the hollow cathode 53 having the circumferential band-shaped ion extraction outlet 54 and at the same time the hollow cathode 53 is heated by the cathode heater 52, so that electrons are supplied by discharge between the anode electrode 13 and the hollow cathode 53 to maintain discharge between the anode electrode 13 and the hollow cathode 53 by the electrons. The ion source and the sputtering apparatus share the anode electrode 13 to irradiate the outer periphery of the object 20 disposed in vacuum atmosphere 73 with ions and sputtered particles.

In the sputtering apparatus as structured above, the target 12 is formed into a circumferential band and the anode electrode 13 is disposed to enclose the target 12, so that the cylindrical object 20 can be coated from an outer periphery thereof. By making the area of the opening 15 small, the pressure within the space 17 can be made higher than the pressure of the portion in which the object 20 is disposed and the atmospheric pressure at the object 20 is maintained low. A magnetic field is produced in the target 12 by the permanent magnet 18 to rotate the electrons, so that a discharge at a low pressure can be maintained.

The length of the electrode 11 or the target 12 is set at 700 mm and the area of the opening 15 forming an outlet of sputtered particles is made small, so that sputtering can be conducted with an atmospheric pressure of $10^{-4}$ or less. In this case, the magnetic flux density in the vicinity of the electrode 11 of the target 12 is 200 gauss or more when the permanent magnet 18 is used.

In the above ion source, the provision of the hollow cathode 53 having the ion extraction outlet 54 in the form of a slot, the acceleration electrode 56 in the form of a slot and the permanent magnet 57 can obtain uniform band-shaped ion beams stably for a long time and accelerates ions without an independent acceleration system.

Figure 9:
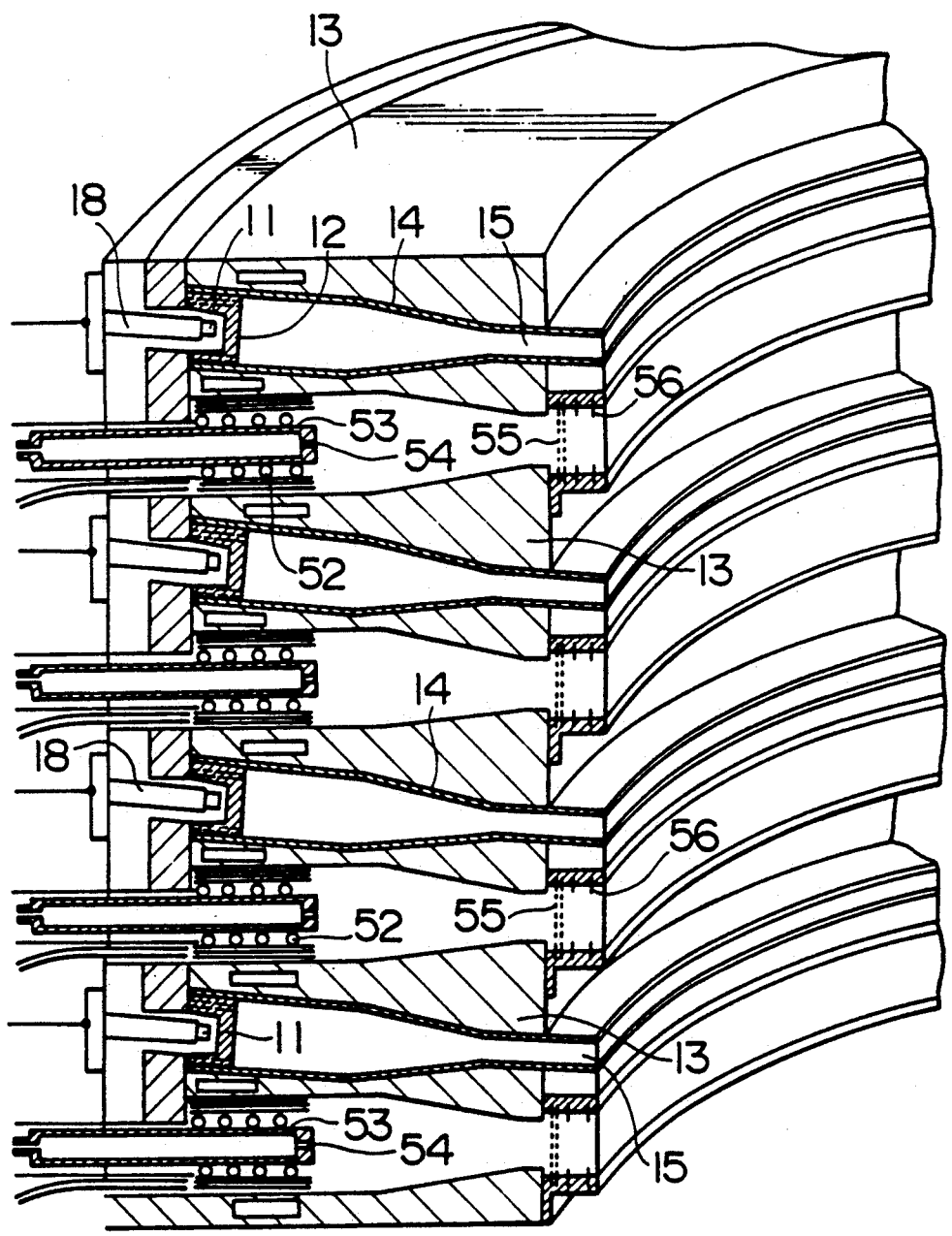
FIG. 9 is a broken perspective view showing a plurality of sputtering apparatus stacked on one another.

Further, since the ion extraction outlet 54 is formed into a circumferential band, the cylindrical object 20 to be coated can be enclosed and stray ions can be reduced to a circumferentially uniform state to concentrate ion particles to effect irradiation. As shown in FIG. 9, such sputtering apparatuses having ion sources can be stacked on one another to enclose the external periphery of a long cylindrical object and ion particles can be concentrated to effect irradiation.

In the above sputtering apparatus having an ion source combined integrally therewith, ion irradiation and sputtered particle irradiation can be made simultaneously from the same direction and the relative angle of the ion irradiation axis and the sputter particle irradiation axis is fixed, so that proper coating conditions can be established. Further, since the ion outlet of the ion source and the sputtered particle outlet of the sputtering apparatus are directed to the same direction, sputtered particles do not enter the ion source and hence the ion source is not contaminated. The vacuum seal apparatus, the cooling apparatus, and the anode electrode 13 can be shared.

In the embodiment illustrated above, extraction of band-shaped beams of ions from a DC discharge plasma has been described. However, extraction and acceleration of band-shaped beams of ions can be made by discharge using high frequency (for example, ECR).

Since the ion source of the present invention utilizes a hollow cathode having an ion extraction outlet extending in the form of a slot and formed into a circumferential shape, ions extracted from the discharge plasma can be concentrated to reduce the amount of stray ions and the life of the electrode can be lengthened. Accordingly, ion particles can be concentrated uniformly to the outer periphery of the cylindrical object to be coated in order to effect irradiation thereof.

Figure 10:
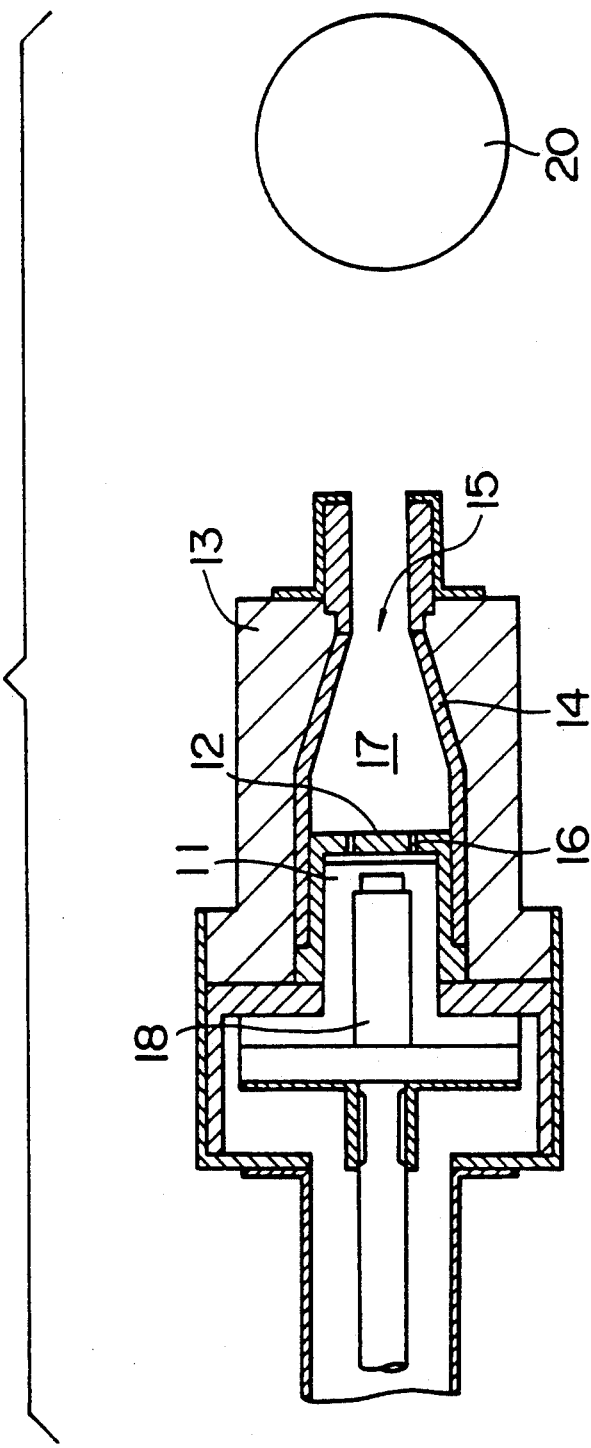
FIG. 10 is a sectional side view of a sputtering apparatus according to a fourth embodiment of the present invention.
Figure 11:
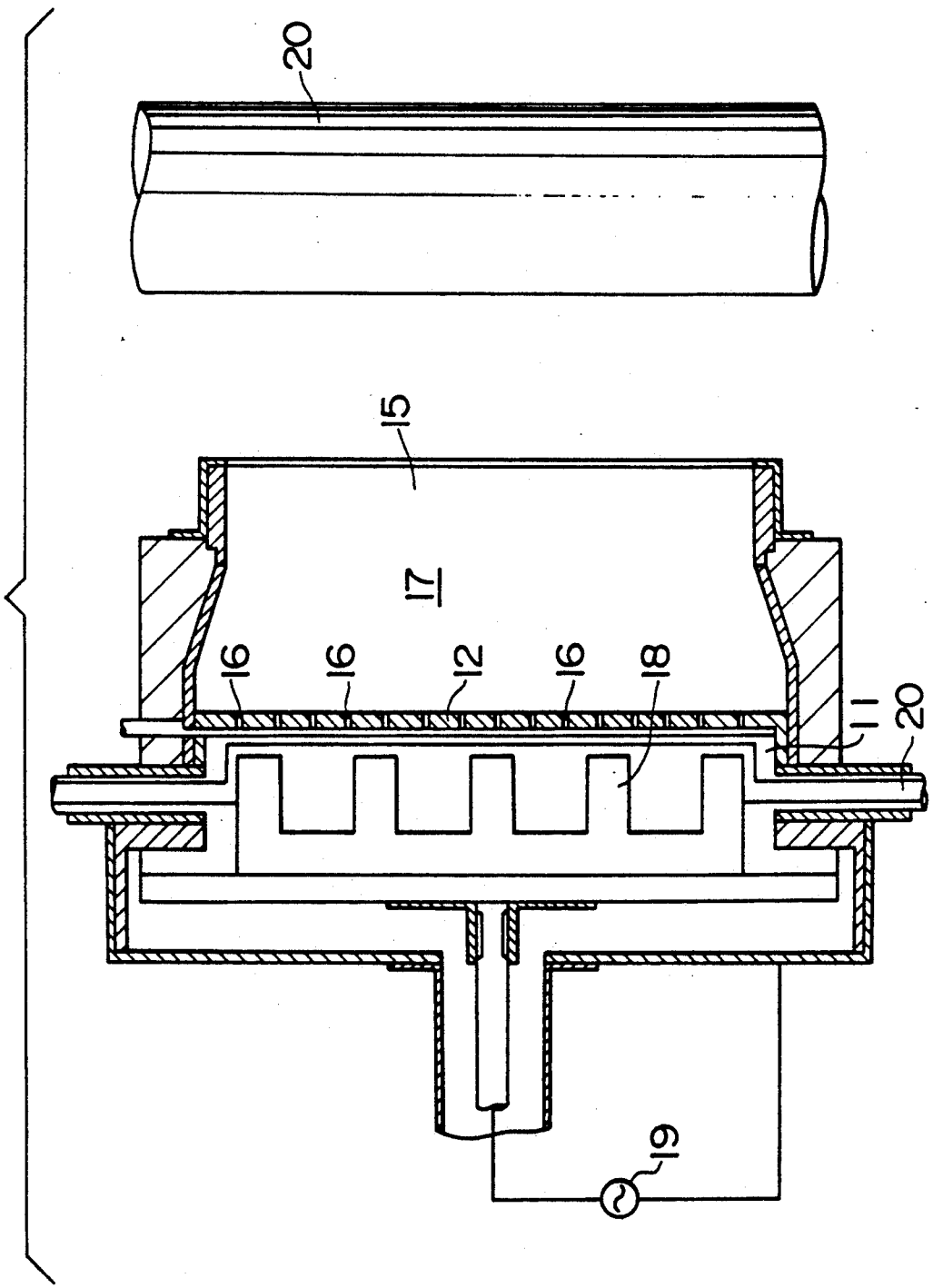
FIG. 11 is a sectional plan view of a sputtering apparatus according to the fourth embodiment of the present invention.

FIG. 10 is a sectional side view of a sputtering apparatus according to a fourth embodiment of the invention, and FIG. 11 is a sectional plan view of FIG. 10.

In the above figures, numeral 11 denotes an electrode which is provided with a band-shaped target 12. The other (anode) electrode 13 encloses the target 12, and an insulator 14 is disposed between the anode electrode 13 and the target 12.

A sputtering outlet opening 15 of the electrode 13 is disposed opposite the electrode to interpose the target 12 between the electrodes 11 and 13 and is formed to have a small area as shown in FIG. 10. The target 12 is formed with a gas introduction inlet 16 whereby sputtering gas is introduced into space 17 enclosed by the electrode 13 between the target 12 and the opening 15. Thus, gas pressure within the space 17 is maintained relatively high.

A permanent magnet 18 is disposed on the opposite side of the target 12 to interpose the electrode 11 between the permanent magnet 18 and the target 12 so that a magnetic field is produced in a portion of the electrode 11 on which the target 12 is disposed. The magnet is not limited to the permanent magnet 18 and an electromagnet can be used therefor.

The electrodes 11 and 13 are supplied with electric power by an external power supply 19. In the figures, numeral 20 denotes a cooling water pipe through which cooling water flows to remove heat generated upon sputtering.

In the sputtering apparatus as structured above, the target 12 is formed into a band and the other electrode 13 is disposed to enclose the target 12, so that the long object 20 can be coated. By making the area of the opening 15 small, the pressure within the space 17 can be made higher than the pressure of the portion in which the object 20 is disposed and the atmospheric pressure of the object 20 is thus maintained low. A magnetic field is produced in the target 12 by the permanent magnet 18 to rotate the electrons, so that discharge at low pressure can be maintained.

The length of the electrode 11 or the target 12 is set at 700 mm and the area of the opening 15 forming an outlet of sputter particles is made small, so that sputtering can be made with an atmospheric pressure of $10^{-4}$ or less. In this case, the magnetic flux density in the vicinity of the electrode 11 of the target 12 is 200 gauss or more when the permanent magnet 18 is used.

In FIG. 10, the target 12 and the anode electrode 13 are covered by the insulator 14, while the target and the insulator in combination shown in Table 1 can be sputtered by using an AC type or a DC type power supply as the power supply 19.

TABLE 1

| Target | Covering Material | |
|---|---|---|
| | Metal | Insulator |
| Metal | DC Power Supply | AC Power Supply |
| Insulator | AC Power Supply | AC Power Supply |

Figure 12:
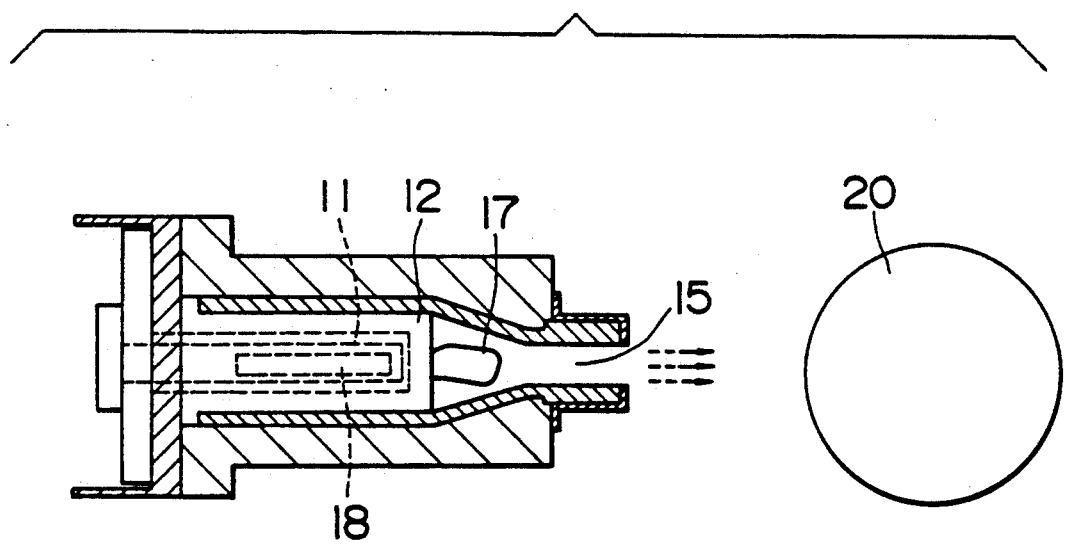
FIG. 12 is a sectional side view of a sputtering apparatus according to a fifth embodiment of the present invention.
Figure 13:
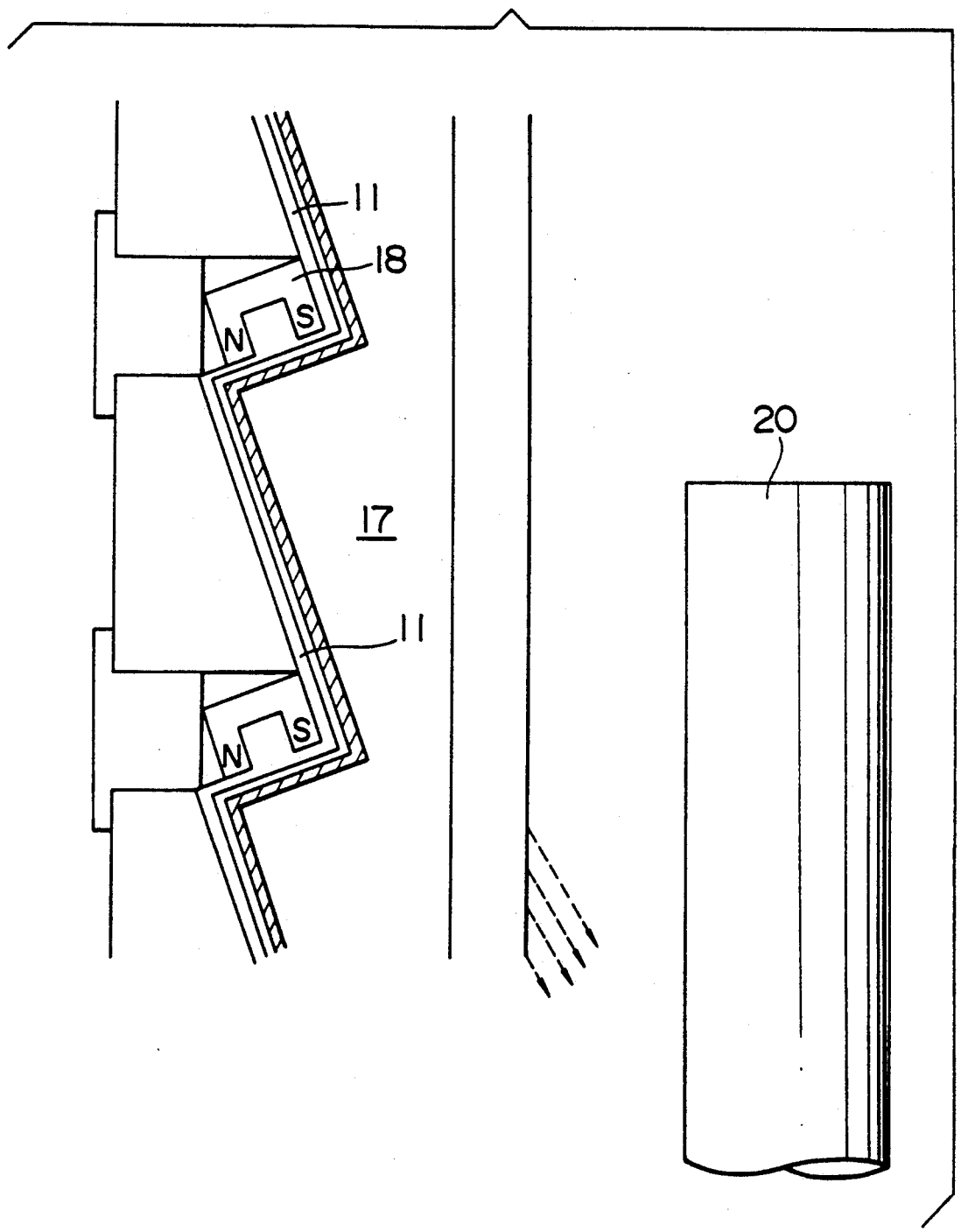
FIG. 13 is a sectional plan view of a sputtering apparatus according to a fifth embodiment of the present invention.

Further, when there is no space for installing the long object in the sputtering apparatus, the electrode 11 and the target 12 can be formed stepwise as shown in FIGS. 12 and 13 to thereby make room for the long object.

In the sputtering apparatus of the present invention, since the target mounted on one electrode is formed into a band with the other electrode disposed to enclose the target provided with the magnet for producing the magnetic field and the area of the sputtered particle outlet of the other electrode is made small, long objects can be uniformly coated and the gas pressure within the other electrode can be made higher than pressure outside of the electrode, in which the object to be coated is disposed, so that atmospheric pressure at the object to be coated can be maintained low. Further, a magnetic field is produced for the target to rotate the electrons, whereby the discharge can be maintained at a low pressure.

Figure 14:
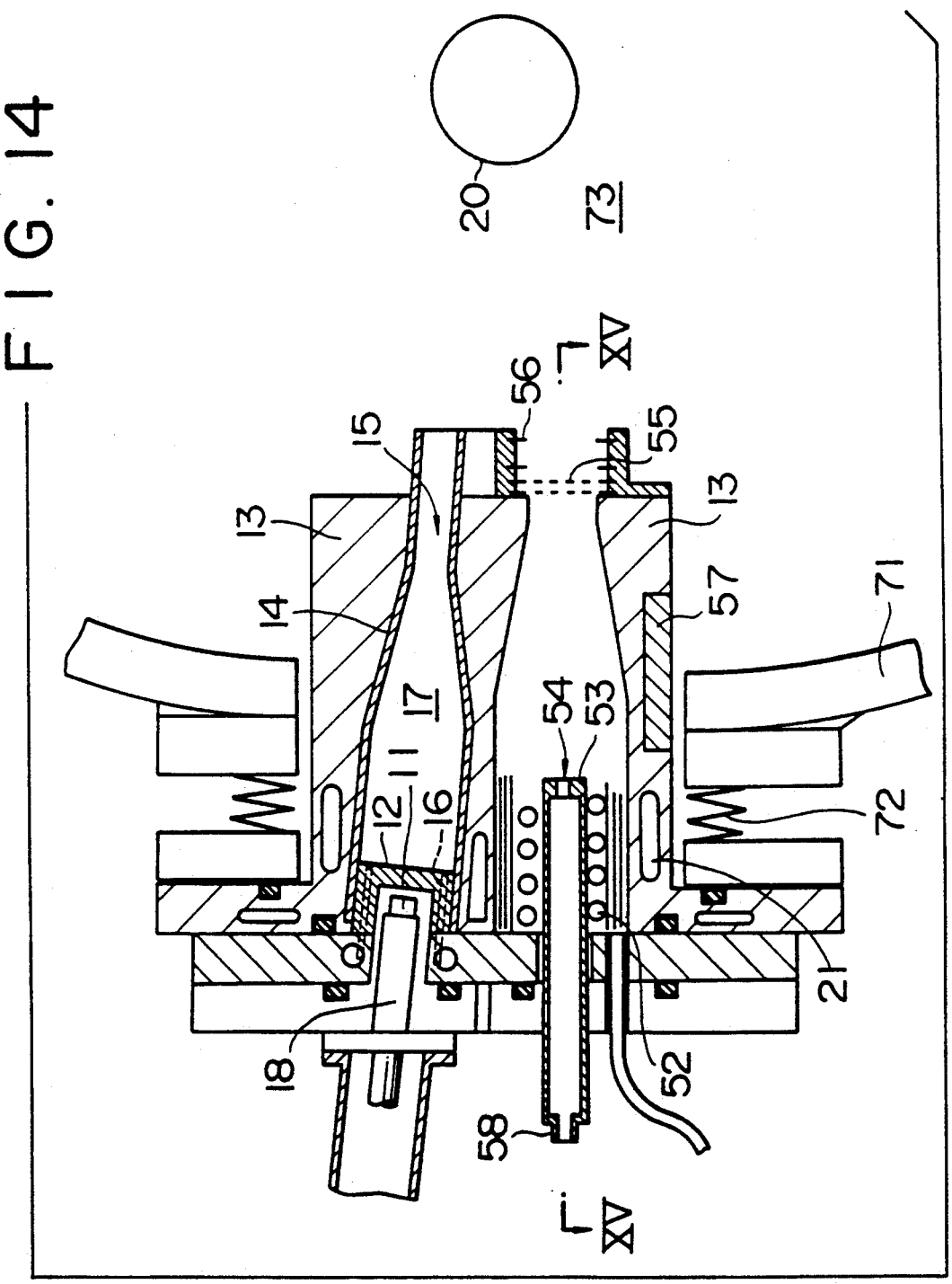
FIG. 14 is a side view of a sputtering apparatus having an ion source combined integrally therewith according to an embodiment of the present invention.
Figure 15:
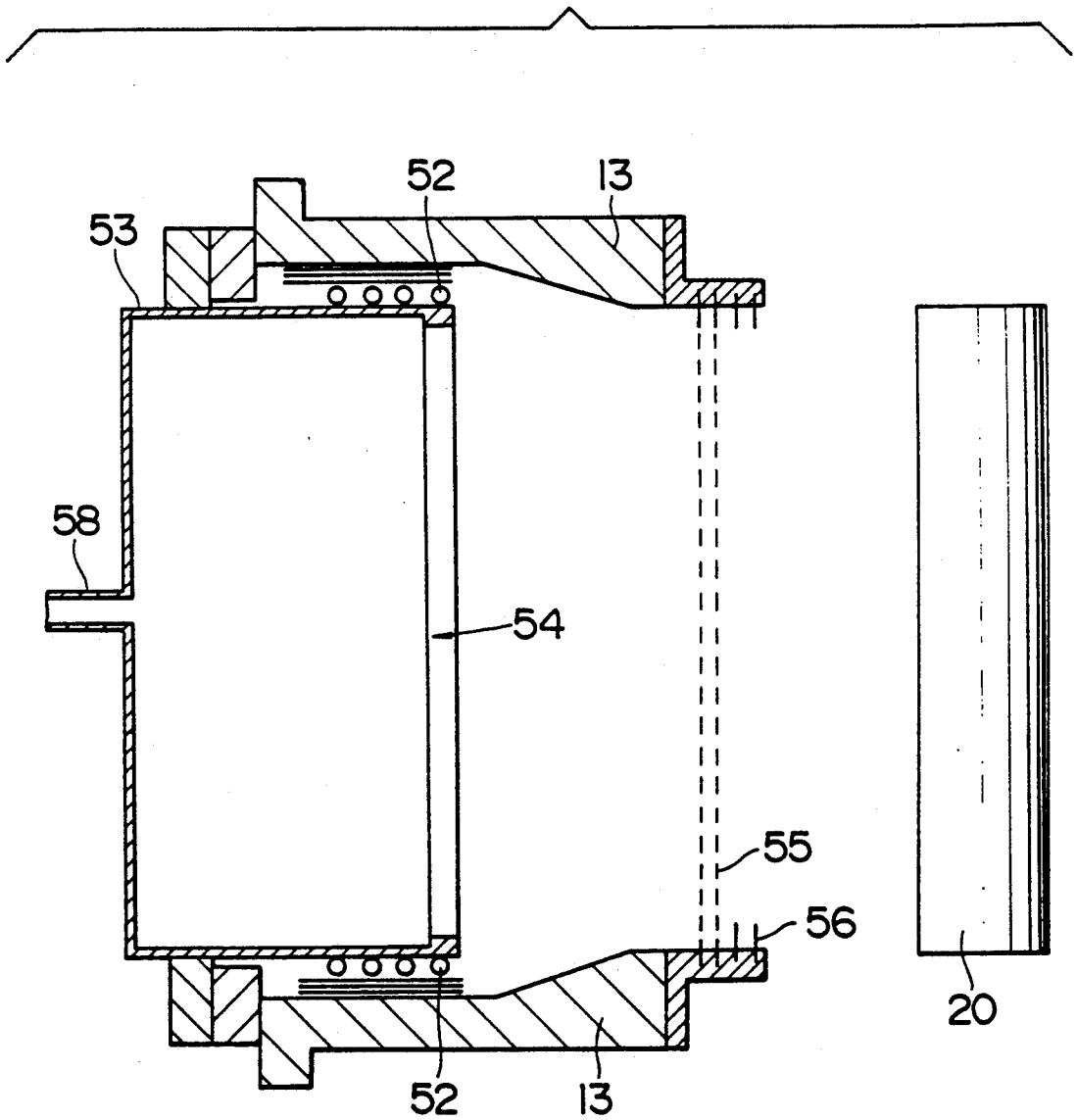
FIG. 15 is a diagram taken along line XV—XV of FIG. 14.

FIG. 14 is a side view of a sputtering apparatus having an ion source combined integrally therewith according to another embodiment of the invention, and FIG. 15 is a diagram taken along line XV—XV of FIG. 14.

Since the arrangement of the electrode, the target and the magnet is the same as that of FIG. 6, the same reference numerals are given to the same elements and description is omitted.

A hollow cathode 53 is attached to an anode electrode 13 through a cathode heater 52. An ion extraction outlet 54 of the hollow cathode 53 extends in the form of a straight slot and an ion extraction electrode 55 extending in the form of a band is disposed in front of the ion extraction outlet 54. An acceleration electrode 56 for controlling the energy of the extracted ions is disposed in front of the ion extraction electrode 55 and is formed into a band shaped hole to match to the shape of the hollow cathode 53. A permanent magnet 57 is disposed outside of the anode electrode 13 and operates as a magnetic field producing mechanism to improve uniformity and density of the straight discharge plasma. A gas introduction hole 58 is formed in the hollow cathode 53 and discharge gas is introduced into the hollow cathode 53 from the gas introduction hole 58.

The above ion source can cope with the long object 20 to be coated. When discharge gas is introduced from the gas introduction hole 58, into the hollow cathode 53 having the ion extraction outlet 54 in the form of a straight band, the hollow cathode 53 is heated by the cathode heater 52 at the same time and electrons are supplied by discharge between the anode electrode 13 and the hollow cathode 53.

The ion source and the sputtering apparatus share the anode electrode 13, which is mounted to a vacuum vessel 71 by means of bellows 72, and the object 20 to be coated is disposed within vacuum atmosphere 73 and irradiated with ions and sputter particles from the same direction.

In the sputtering apparatus as structured above, the target 12 is formed into a band and the anode electrode 13 is disposed to enclose the target 12, so that the long object 20 can be uniformly coated. By making the area of the opening 15 small, pressure within the space 17 can be made higher than the pressure of the portion in which the object 20 is disposed and the atmospheric pressure of the object 20 can be maintained low. A magnetic field is produced in the target 12 by the permanent magnet 18 to rotate the electrons, so that discharge at low pressure can be maintained.

The length of the electrode 11 or the target 12 is set at 700 mm and the area of the opening 15 forming an outlet of sputtered particles is made small, so that sputtering can be conducted with an atmospheric pressure of $10^{-4}$ or less. In this case, the magnetic flux density in the vicinity of the electrode 11 of the target 12 is 200 gauss or more when the permanent magnet 18 is used.

In FIG. 14, the target 12 and the electrode 11 are covered by the insulator 14, while the target and the insulator in combination shown in Table 1 can be used by an AC type or a DC type power supply as the power supply 19.

Figure 17:
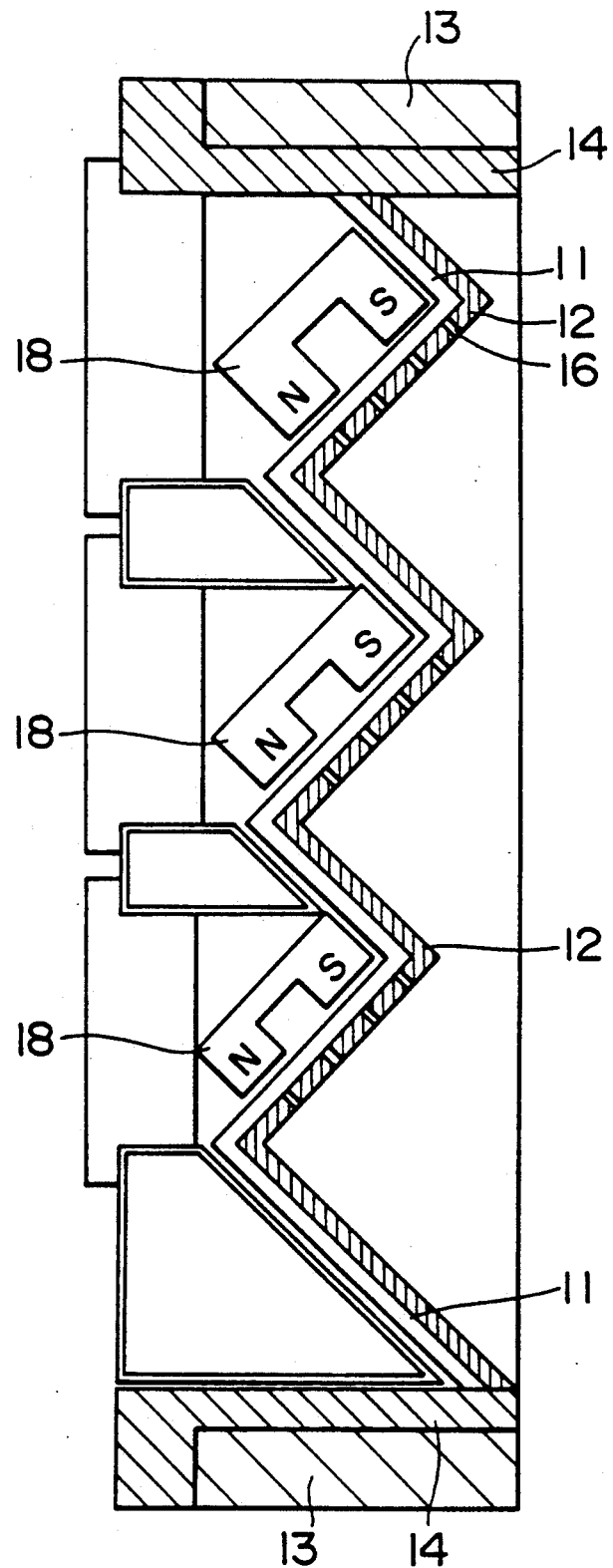
FIG. 17 is a plan view of a sputtering apparatus having an ion source combined integrally therewith according to another embodiment of the present invention.
Figure 18:
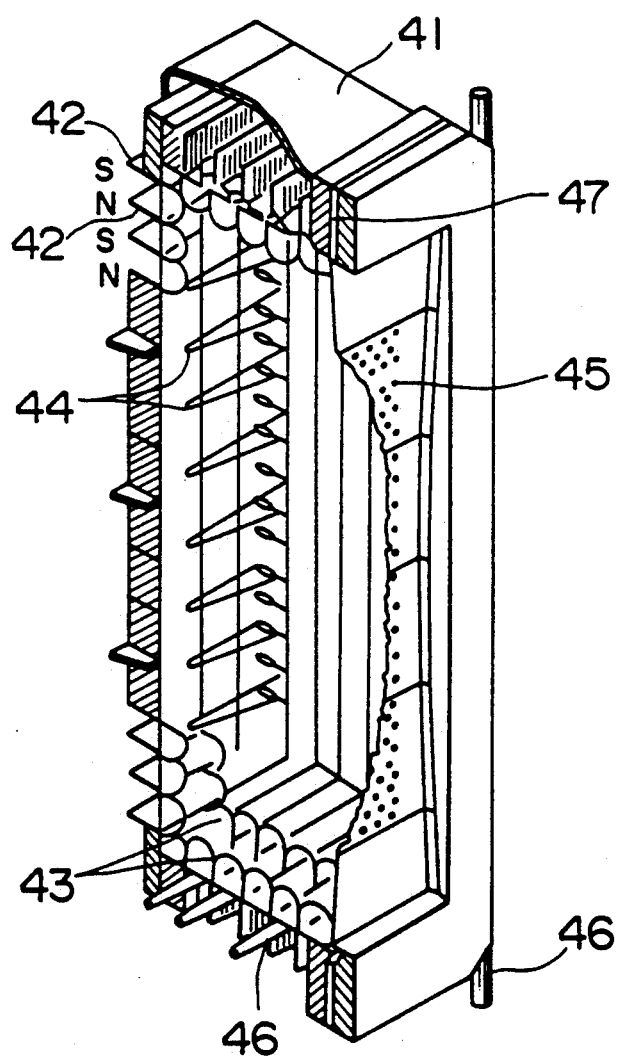
FIG. 18 is a partially broken perspective view of a conventional ion source.
Figure 19:
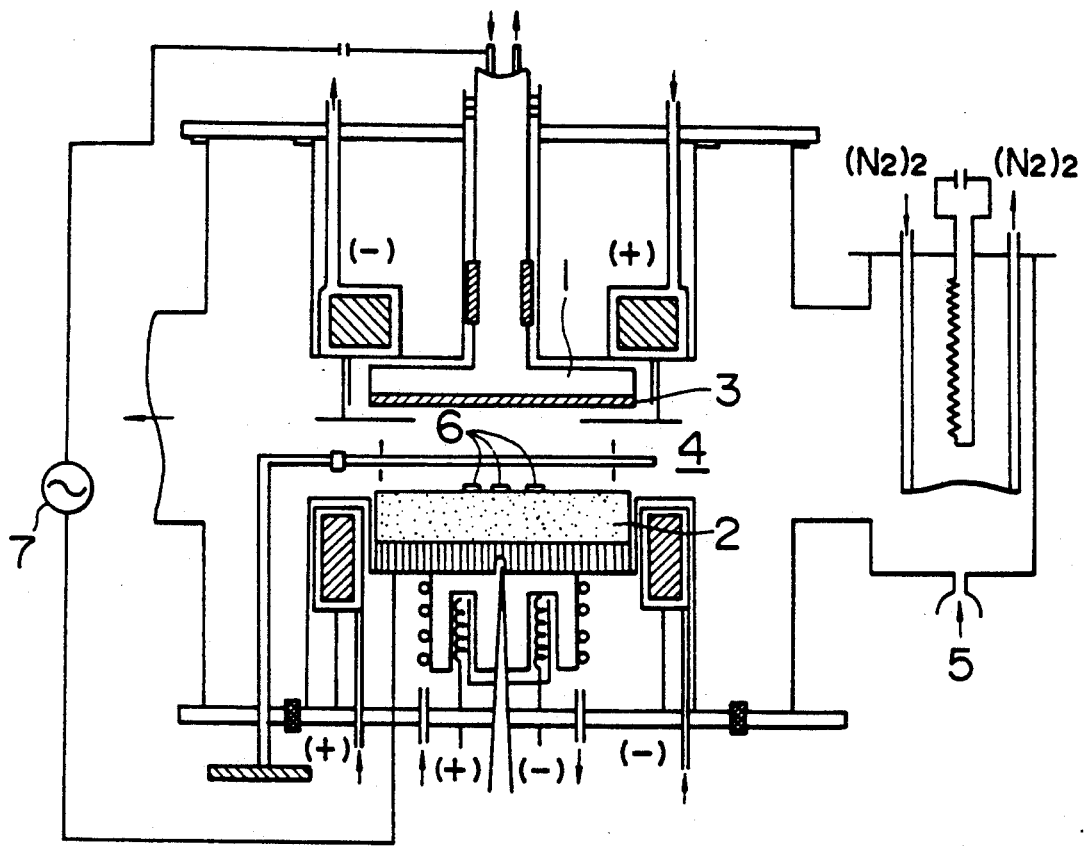
FIG. 19 is a schematic diagram illustrating a conventional sputtering apparatus.
Figure 20:
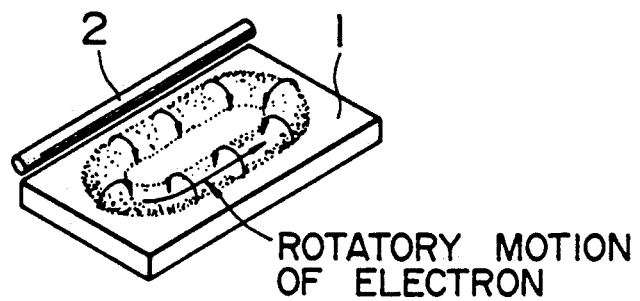
FIG. 20 is a diagram schematically illustrating an idea of a planar magnetron type sputtering apparatus and FIG. 21 is a graph representing a relation of magnetic flux density and vacuum pressure.
Figure 21:
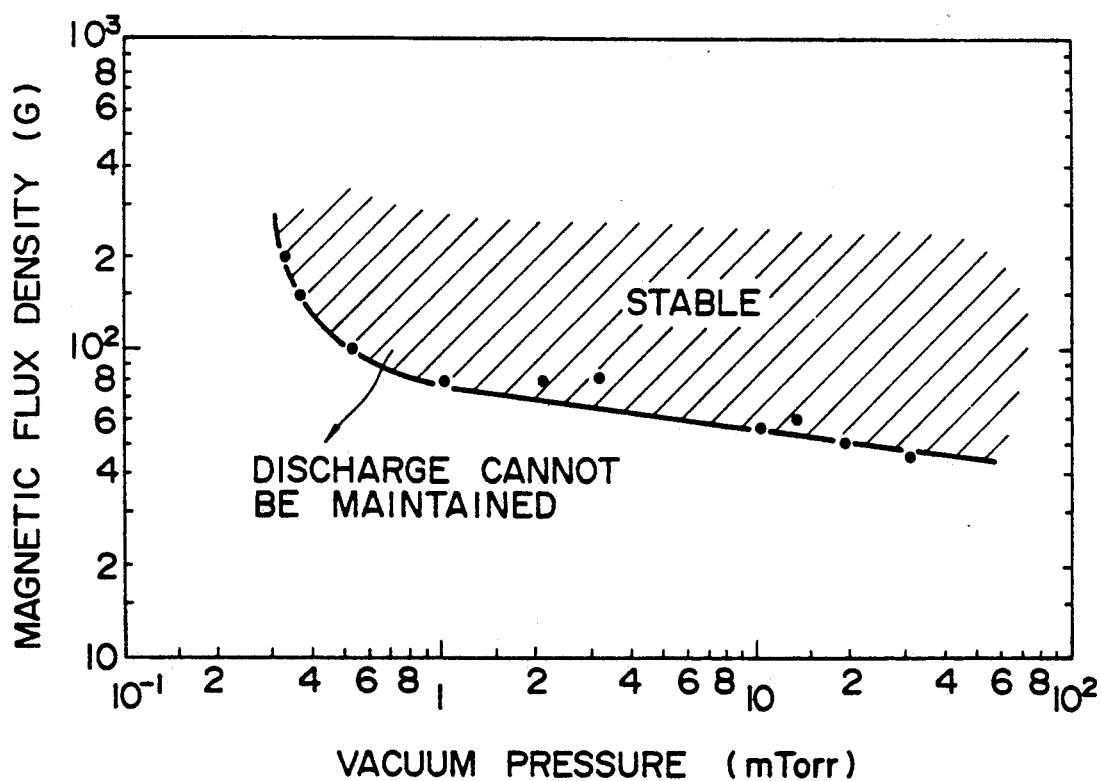

Further, when there is no space for installing the long object in the sputtering apparatus, the electrode 11 and the target 12 can be formed stepwise as shown in FIG. 17 to permit installation of the long object.

In the above ion source, a uniform band-shaped ion beam can be obtained stably for a long time by the provision of the hollow cathode 53 having a band-shaped ion extraction outlet 54, the acceleration electrode 56 having a band-shaped hole, and the permanent magnet 57. Also, ions can be accelerated without separate provision of an acceleration system.

The band-shaped ion extraction structure using DC discharge plasma has been shown by way of example: however, the band-shaped ion extraction acceleration can be made by discharge using a high frequency (for example, ECR).

Figure 16:
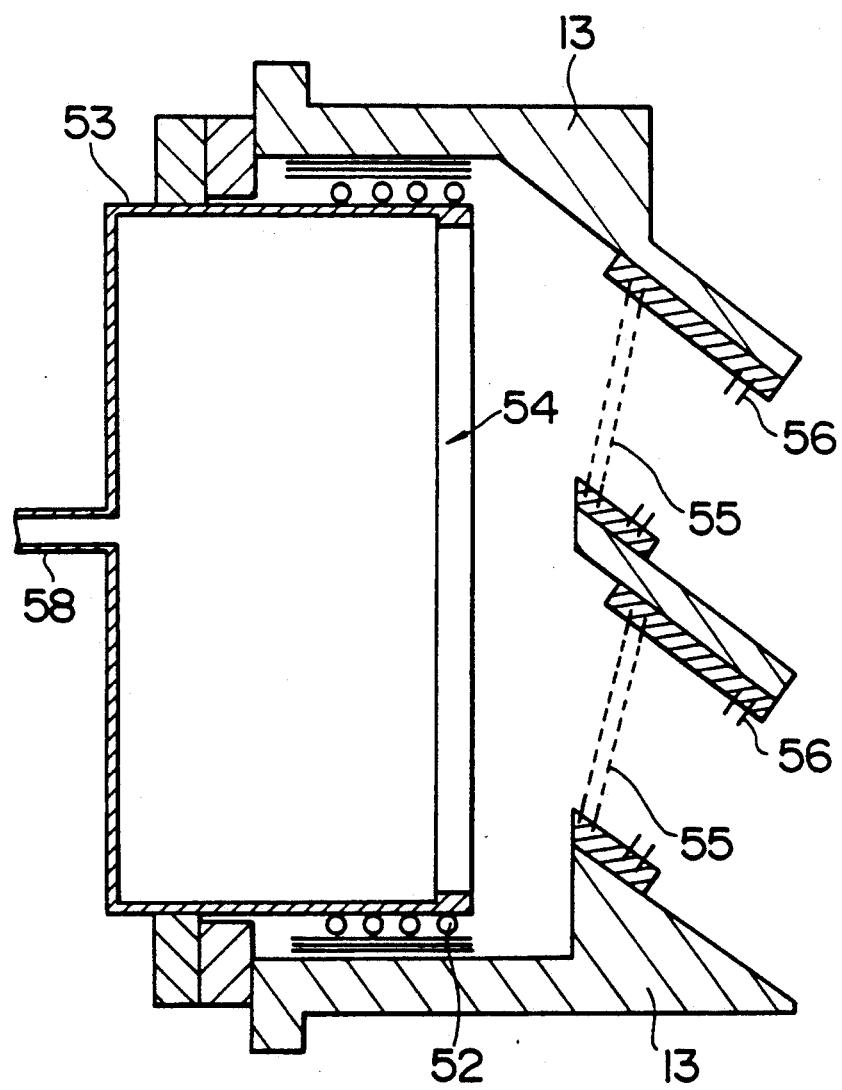
FIG. 16 is a plan view of an ion source in a sputtering apparatus having an ion source combined integrally therewith according to another embodiment of the present invention.

When a long object 20 is desired to be irradiated by an ion beam with a fixed angle, the ion extraction electrode 55 and the acceleration electrode 56 can be inclined as shown in FIG. 16 if there is no disposition space in the vacuum apparatus. In FIG. 16, by shifting the phase between two ion drawing electrodes 55, ions having a fixed angle with respect to an extraction plane can be obtained.

In the sputtering apparatus having the ion source combined integrally therewith, ion irradiation and sputtered particle irradiation can be made simultaneously from the same direction and the relative angle between irradiation axes of ions and sputtered particles can be fixed, so that proper filming conditions can be established. Further, since the ion outlet of the ion source and the sputtered particle outlet of the sputtering apparatus are disposed in the same direction, sputtered particles do not enter the ion source and the ion source is not contaminated. The vacuum seal apparatus, the cooling apparatus, and the anode electrode 13 can be shared.

In the sputtering apparatus of the present invention having the ion source combined integrally therewith, since the target on one electrode is formed into a band with the other electrode disposed to enclose the target provided with the magnet for producing the magnetic field and the area of the sputtered particle outlet of the other electrode is made small, long objects can be uniformly coated and the pressure within the other electrode can be made higher than the pressure outside of the electrode, in which the object to be filmed is disposed. Consequently, the atmospheric pressure at the object to be coated can be maintained low and convergence of ions can be improved by using the ion source. Further, a magnetic field is produced at the target to rotate electrons and discharge can be maintained at a low pressure.

Further, since the ion source in the sputtering apparatus of the present invention comprises a hollow cathode having an ion extraction outlet extending in the form of a straight band and a magnetic flux producing mechanism for effectively producing discharge plasma, a straight discharge plasma is produced uniformly with high density and the life of the electrode is increased. Further, since an acceleration electrode for controlling the energy of the drawn out ions is provided, ions extracted from the discharge plasma can be accelerated and the ion beam can be accelerated with an equal electric field.

In the sputtering apparatus having the ion source combined integrally therewith of the present invention, since the irradiation openings of the ion source and the sputtering apparatus are disposed adjacent to each other and are integrated, long objects to be coated can be irradiated from the same direction and proper coating conditions can be established.

We claim:

1. A sputtering apparatus including two electrodes, a sputtering target disposed on one of the electrodes, means for supplying a discharge gas in a vacuum to produce an electric discharge between the two electrodes and whereby particles sputtered from the target due to impact thereon of ions produced by the discharge are deposited on a substrate, wherein the target disposed on one electrode is formed into an elongated band and the other electrode is disposed so as to enclose the target, said other electrode being provided with a magnet for producing a magnetic field thereon, said other electrode further having a narrow elongated slot which defines a narrow sputter particle outlet, wherein said narrow sputter particle outlet permits a pressure to exist near said discharge which is higher than the pressure near the substrate.

2. A sputtering apparatus having an ion source combined integrally therewith, wherein said ion source includes means for supplying a discharge gas in vacuum and for producing discharge plasma by direct current or high frequency to extract ions from the discharge plasma and which further includes a hollow cathode having an ion extraction outlet extending in the form of straight slot and a magnetic flux producing mechanism for effectively producing said discharge plasma is integrally combined with means for sputtering including two electrodes and a target disposed on one of said electrodes and including means for supplying a discharge gas in vacuum to produce an electric discharge between said two electrodes whereby particles sputtered from the target due to impact thereon of ions produced by the discharge are deposited on a substrate, the target disposed on one electrode being formed into an elongated band, the other electrode being disposed so as to enclose the target, said other electrode being provided with a magnet for producing a magnetic field thereon, said other electrode further having an elongated slot which defines a narrow sputter particle outlet to thereby irradiate an object-to-be-coated with ions and sputtering particles from the same direction.

* * * * *